United States Patent
Hu et al.

(10) Patent No.: US 11,715,774 B2
(45) Date of Patent: Aug. 1, 2023

(54) VERTICAL GALLIUM OXIDE (GA2O3) POWER FETS

(71) Applicant: Cornell University, Ithaca, NY (US)

(72) Inventors: Zongyang Hu, Ithaca, NY (US);
Kazuki Nomoto, Ithaca, NY (US);
Grace Huili Xing, Ithaca, NY (US);
Debdeep Jena, Ithaca, NY (US);
Wenshen Li, Ithaca, NY (US)

(73) Assignee: Cornell University, Ithaca, NY (US)

( * ) Notice: Subject to any disclaimer, the term of this patent is extended or adjusted under 35 U.S.C. 154(b) by 26 days.

(21) Appl. No.: 17/042,153

(22) PCT Filed: Mar. 28, 2019

(86) PCT No.: PCT/US2019/024634
§ 371 (c)(1),
(2) Date: Sep. 27, 2020

(87) PCT Pub. No.: WO2019/191465
PCT Pub. Date: Oct. 3, 2019

(65) Prior Publication Data
US 2021/0013314 A1    Jan. 14, 2021

Related U.S. Application Data

(60) Provisional application No. 62/649,281, filed on Mar. 28, 2018.

(51) Int. Cl.
*H01L 29/417* (2006.01)
*C30B 29/16* (2006.01)
*H01L 29/66* (2006.01)
*H01L 29/78* (2006.01)

(52) U.S. Cl.
CPC ........ *H01L 29/41741* (2013.01); *C30B 29/16* (2013.01); *H01L 29/66969* (2013.01); *H01L 29/7827* (2013.01)

(58) Field of Classification Search
CPC .......... H01L 29/41741; H01L 29/7827; H01L 29/66969
See application file for complete search history.

(56) References Cited

U.S. PATENT DOCUMENTS

| 4,521,499 A | 6/1985 | Switzer | |
| 5,939,754 A * | 8/1999 | Hoshi | H01L 29/7813 257/342 |

(Continued)

FOREIGN PATENT DOCUMENTS

| CN | 208062057 U | 11/2018 |
| WO | 2018045175 A1 | 3/2018 |

OTHER PUBLICATIONS

Higashiwaki et al. "Development of gallium oxide power devices", Phys. Status Solidi A 211, No. 1, 21-26 (2014) / DOI 10.1002/pssa. 201330197 (Year: 2013).*

(Continued)

*Primary Examiner* — Vincent Wall
(74) *Attorney, Agent, or Firm* — Culhane Meadows PLLC; Orlando Lopez

(57) ABSTRACT

A vertical gallium oxide (Ga2O3) device having a substrate, an n-type $Ga_2O_3$ drift layer on the substrate, an, n-type semiconducting channel extending from the n-type $Ga_2O_3$ drift layer, the channel being one of fin-shaped or nanowire shaped, an n-type source layer disposed on the channel; the source layer has a higher doping concentration than the channel, a first dielectric layer on the n-type Ga2O3 drift layer and on sidewalls of the n-type semiconducting channel, a conductive gate layer deposited on the first dielectric layer and insulated from the n-type source layer, n-type semiconducting channel as well as n-type Ga2O3 drift layer, a second dielectric layer deposited over the conductive gate layer, covering completely the conductive gate layer on channel sidewalls and an ohmic source contact deposited (Continued)

over the n-type source layer and over at least a part of the second dielectric layer; the source contact being configured not to be in electrical contact with the conductive gate layer.

32 Claims, 12 Drawing Sheets

(56) References Cited

U.S. PATENT DOCUMENTS

| | | | |
|---|---|---|---|
| 10,056,500 | B2 | 8/2018 | Li et al. |
| 2004/0079989 | A1* | 4/2004 | Kaneko ............. H01L 29/66068 257/328 |
| 2013/0043468 | A1 | 2/2013 | Adekore |
| 2013/0313640 | A1 | 11/2013 | Shen |
| 2015/0380548 | A1* | 12/2015 | Wang .................. H01L 27/0688 257/329 |
| 2017/0018627 | A1 | 1/2017 | Li et al. |
| 2017/0213918 | A1 | 7/2017 | Sasaki et al. |
| 2017/0309527 | A1 | 10/2017 | Chen et al. |
| 2018/0315820 | A1 | 11/2018 | Kub et al. |

OTHER PUBLICATIONS

Matsuzaki et al., "Field-induced current modulation in epitaxial film of deep-ultraviolet transparent oxide semiconductor Ga2O3", Appl. Phys. Lett. 88, 092106 (2006); https://doi.org/10.1063/1.2179373 (Year: 2006).*

*Trustees of Boston University* v. *Everlight Elec. Co. Ltd.*, 896 F.3d 1357 (2018) (Year: 2018).* https://www.merriam-webster.com/dictionary/on?utm_campaign=sd &utm_medium=serp&utm_source=jsonld (Year: 2022).* https://dictionary.cambridge.org/us/dictionary/english/on (Year: 2022).*

Richard J. Phillips et al., Electrochemical and photoelectrochemical deposition of thallium(III) oxide thin films, J. Mater. Res., vol. 4, No. 4, Jul./Aug. 1989; pp. 923-929.

H. P. Geserich, Optische und elektrische Messungen an diinnen Thallium(III)-Oxydschichten, Phys. Status Solidi 25, 741 (1968).

https://periodic-table.com/nihonium/ retrieved on Nov. 7, 2021.

Oliver Bierwagen, Indium oxide—a transparent, wide-band gap semiconductor for (opto)electronic applications, Semiconductor Science and Technology, 30, 2015, 024001.

Shuzheng Shi et al., Structural and Optical Properties of Amorphous Al2 O3 Thin Film Deposited by Atomic Layer Deposition, Advances in Condensed Matter Physics, vol. 2018, Article ID 7598978, 2018.

Joel B. Varley et al., Prospects for n-type doping of (AlxGa1_x)2O3 alloys, Appl. Phys. Lett. 116, 172104 (2020).

P. Ranga et al., Si-doped β-(Al0.26Ga0.74)2O3 thin films and heterostructures grown by metalorganic vapor-phase epitaxy, Appl. Phys. Express 12, 111004 (2019).

https://www.chemeurope.com/en/encyclopedia/Boron_trioxide.html retrieved on Nov. 7, 2021.

* cited by examiner

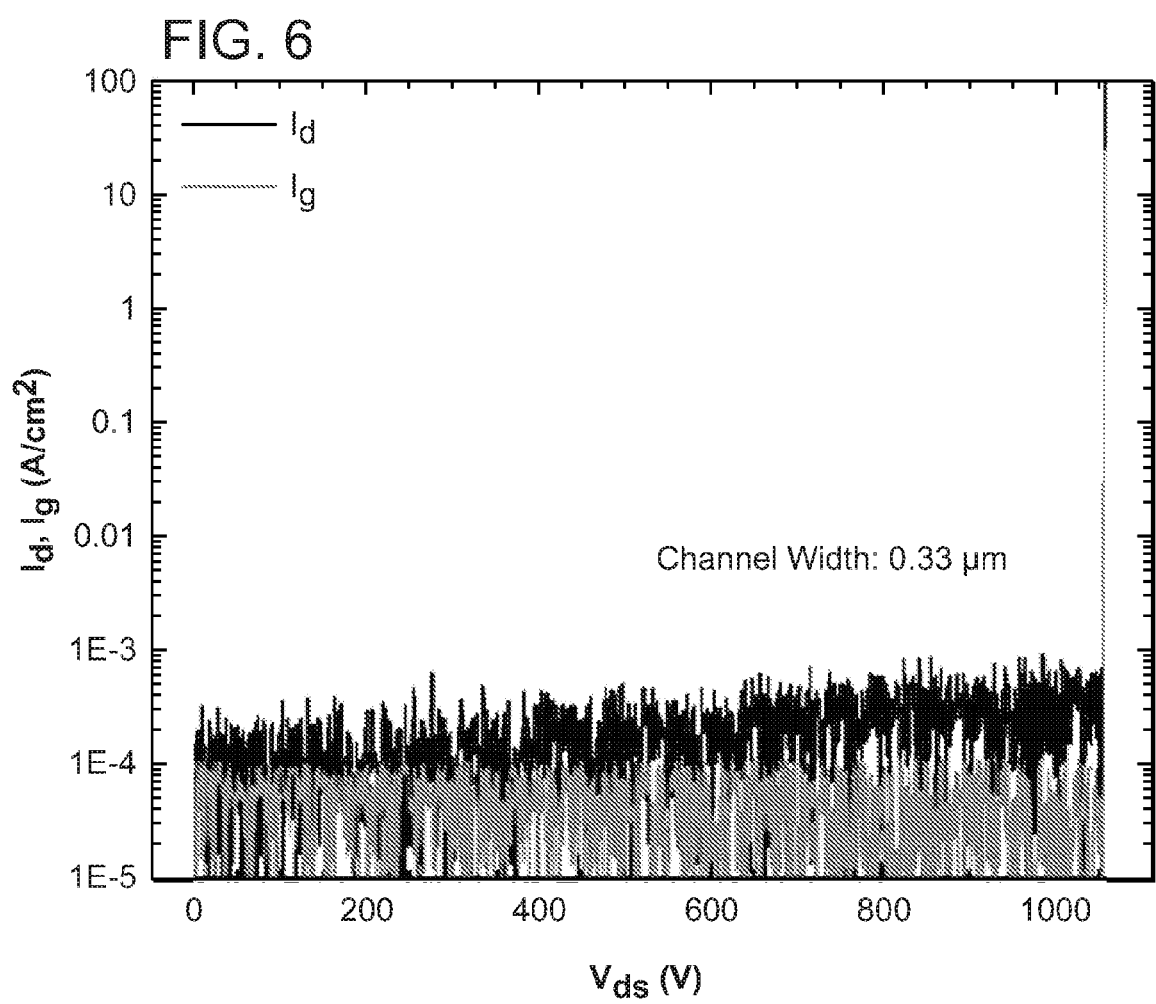

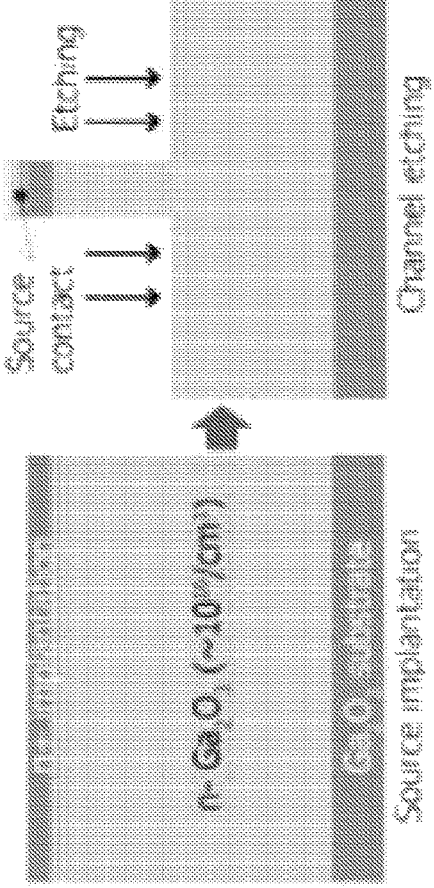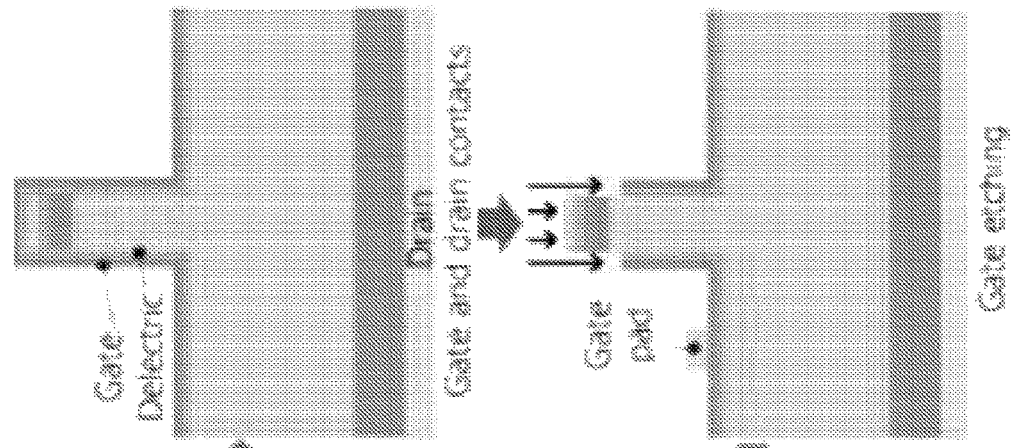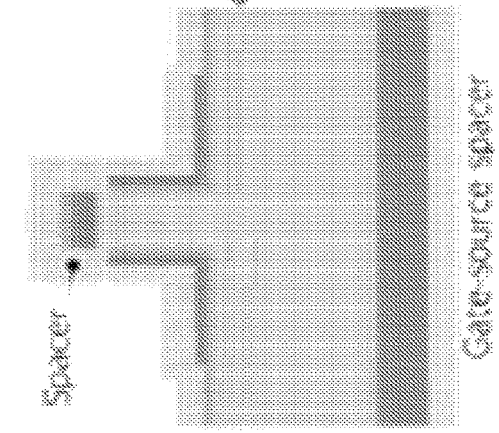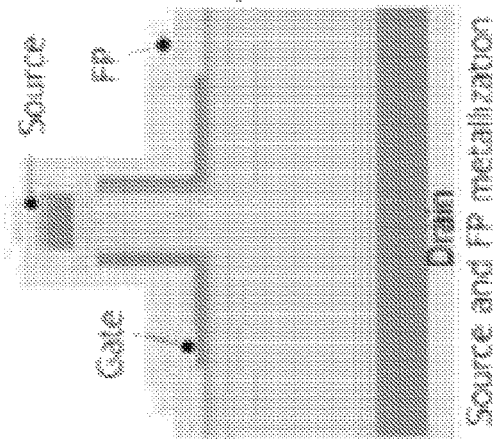
Fig. 9A  FIG. 9B  FIG. 9C  FIG. 9D  FIG. 9E  Fig. 9F

VERTICAL GALLIUM OXIDE (GA2O3) POWER FETS

CROSS-REFERENCE TO RELATED APPLICATIONS

This application claims priority to U.S. Provisional Patent Application No. 62/649,281, filed Mar. 28, 2018, which is incorporated herein by reference in its entirety and for all purposes.

GOVERNMENT FUNDING

This invention was made with Government support from the National Science Foundation under Sponsor Project ID DMREF 1534303 and the Air Force Office of Scientific Research under Sponsor Project ID FA9550-17-0048. The Government has certain rights in this invention.

BACKGROUND OF THE INVENTION

Field of the Invention

The subject disclosure relates to apparatus and methods of making high power vertical metal-oxide-semiconductor field-effect transistors using gallium trioxide bulk substrate and epitaxy.

Background of the Related Art

Gallium oxide has emerged as a new semiconductor material for high-power applications in recent years. As the most stable form monoclinic β-Ga2O3 has been reported with a wide bandgap up to 4.9 eV, a high expected breakdown electric field up to 8 MV/cm and a decent intrinsic electron mobility limit of 250 cm2/Vs, which enables high-voltage and high-power operation. The experimentally reported critical electric field up to 5.2 MV/cm already exceeds that of SiC and GaN, and electron mobility of 100-150 cm2/Vs has been achieved in both bulk substrates as well as epitaxial layers. In addition, low-cost, large area single-crystal substrates allow high-quality epitaxial layers to be developed using various methods.

Following the first demonstration of Ga2O3-nanomembrane field-effect transistors (FETs), this device platform has reached a high current density of 600 mA/mm. Lateral Ga2O3 MOSFETs on semi-insulating bulk substrates with field plates are reported to show a breakdown voltage as high as 750 V. Both lateral FinFETs to attain enhancement-mode operation as well as vertical FinFET to attain high areal current density have also been demonstrated. Vertical Schottky diodes on n-type bulk substrates and halide vapor phase epitaxial (HVPE) structures are also developed, showing the potential of high-voltage vertical Ga$_2$O$_3$ devices.

Most high power Ga$_2$O$_3$ transistors reported in the literature have lateral channels and breakdown voltages are <1 kV. Compared to lateral channel transistors, the vertical channel transistors usually allow higher current per unity chip area. There are existing publications on Ga$_2$O$_3$ based vertical transistors. However, they have not achieved high voltage operations. There are existing publications on GaN based vertical transistors with high voltage and high current operation. However, their fabrication processes are based on a different material system, and are not straightforward in applying to the Ga$_2$O$_3$ transistors.

There is a need for high power Ga$_2$O$_3$ transistors that have breakdown voltages are greater than 1 kV.

SUMMARY

Designs and fabrication of high power Ga$_2$O$_3$ transistors that have breakdown voltages are greater than 1 kV are disclosed herein below.

In one or more embodiments, the vertical gallium oxide (Ga$_2$O$_3$) device of the subject technology includes a substrate, an n-type Ga$_2$O$_3$ drift layer on the substrate, an, n-type semiconducting channel extending from the n-type Ga$_2$O$_3$ drift layer, the channel being one of fin-shaped or nanowire shaped, an n-type source layer disposed on the channel; the source layer has a higher doping concentration than the channel, a first dielectric layer on the n-type Ga$_2$O$_3$ drift layer and on sidewalls of the n-type semiconducting channel, a conductive gate layer deposited on the first dielectric layer and insulated from the n-type source layer, n-type semiconducting channel as well as n-type Ga$_2$O$_3$ drift layer, a second dielectric layer deposited over the conductive gate layer, covering completely the conductive gate layer on channel sidewalls and an ohmic source contact deposited over the n-type source layer and over at least a part of the second dielectric layer; the source contact being configured not to be in electrical contact with the conductive gate layer.

In some instance, the vertical gallium oxide (Ga$_2$O$_3$) device of the subject technology also includes a drain layer in electrical contact with the n-type Ga$_2$O$_3$ drift layer at a location opposite to a channel location.

A number of other embodiments are also disclosed

It should be appreciated that the subject technology can be implemented and utilized in numerous ways, including without limitation as a process, an apparatus, a system, a device, a method for applications now known and later developed. These and other unique features of the system disclosed herein will become more readily apparent from the following description and the accompanying drawings.

BRIEF DESCRIPTION OF THE DRAWINGS

So that those having ordinary skill in the art to which the disclosed system pertains will more readily understand how to make and use the same, reference may be had to the following drawings.

FIG. 6 shows representative three-terminal off-state (at $V_{gs}=0$ V) $I_d/I_g$-$V_{ds}$ characteristics and breakdown voltage of $Ga_2O_3$ vertical power MISFETs as in FIG. 1;

FIGS. 9A-9F show the device fabrication process flow of the embodiment shown in FIG. 7A;

DETAILED DESCRIPTION

Figure 1A:
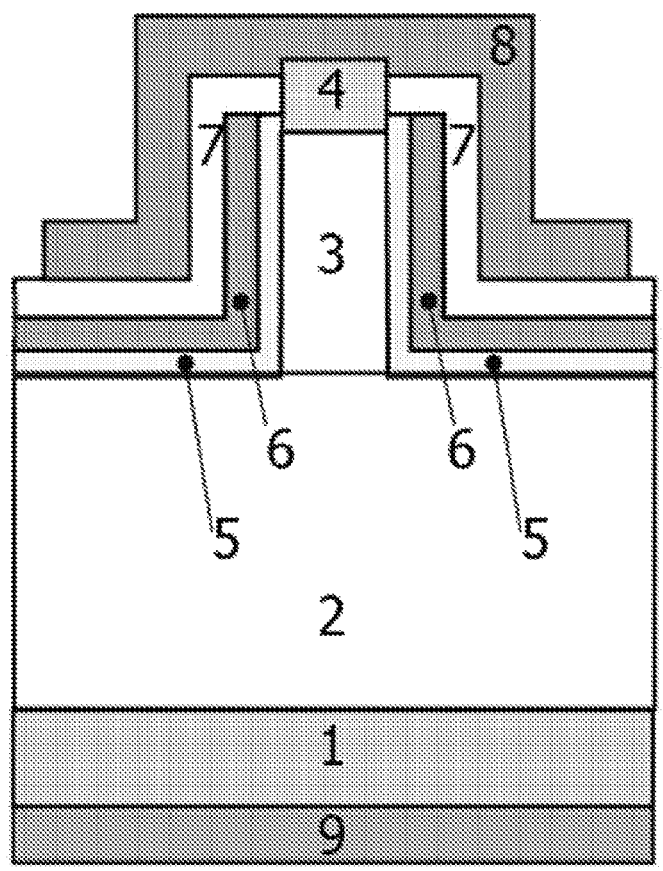
FIG. 1A is a schematic cross-section of an embodiment of a Ga$_2$O$_3$ vertical power device in accordance with the subject technology.

The subject technology relates to apparatus and methods of making high power vertical metal-oxide-semiconductor field-effect transistors using beta-Ga2O3 bulk substrate and epitaxy. The transistors are capable of high current (>1 kA/cm2) and high voltage (>1 kV) operations and can be designed as both depletion and enhancement mode transistors. The advantages, and other features of the systems and methods disclosed herein, will become more readily apparent to those having ordinary skill in the art from the following detailed description of certain preferred embodiments taken in conjunction with the drawings which set forth representative embodiments of the subject technology. The subject technology can be utilized in applications as high power switches. These switches can be used as power switches in electrical systems, including electric vehicles, power supplies, power grids, and the like. The subject technology can also be used in applications such as logic switches. These switches can be connected as simple circuits to perform logic functions such as an inverter, ring oscillator, and the like.

"Nano wire," as used here in refers to a nano-wire configuration of any arbitrary cross-section.

A vertical group III trioxide transistor of these teachings comprises a drain contact layer, a substrate on the drain contact layer, an n-type group III trioxide material layer on the substrate, wherein the n-type group III trioxide material layer forms an upstanding channel having a distal top surface and a sidewall extending between the distal top surface and the n-type group III trioxide material layer, a source layer applied directly to the distal top surface, a gate dielectric layer deposited on the n-type group III trioxide material layer, wherein a portion of the gate dielectric layer is on the sidewall, a gate layer on the gate dielectric layer including the portion on the sidewall but not connected to the source layer, a dielectric spacer layer deposited over a sidewall of the source layer, the sidewall of the channel, the gate layer and the gate dielectric layer, and, a source-connected metal layer deposited over the source layer and the dielectric spacer layer In one or more embodiments, the subject technology discloses a vertical gallium oxide (Ga2O3) device a substrate, an n-type Ga2O3 drift layer on the substrate, an, n-type semiconducting channel extending from the n-type Ga2O3 drift layer, the channel being one of fin-shaped or nanowire shaped, an n-type source layer disposed on the channel; the source layer has a higher doping concentration than the channel, a first dielectric layer on the n-type Ga2O3 drift layer and on sidewalls of the n-type semiconducting channel, a conductive gate layer deposited on the first dielectric layer and insulated from the n-type source layer, n-type semiconducting channel as well as n-type Ga2O3 drift layer, a second dielectric layer deposited over the conductive gate layer, covering completely the conductive gate layer on channel sidewalls and an ohmic source contact deposited over the n-type source layer and over at least a part of the second dielectric layer; the source contact being configured not to be in electrical contact with the conductive gate layer.

In some instance, the vertical gallium oxide ($Ga_2O_3$) device of the subject technology also includes a drain layer in electrical contact with the n-type $Ga_2O_3$ drift layer at a location opposite to a channel location.

FIG. 1A shows one embodiment of the vertical gallium oxide ($Ga_2O_3$) device of the subject technology. In FIG. 1A, a schematic cross-section of a $Ga_2O_3$ vertical power MISFET in accordance with an embodiment of the subject technology is shown. The example shown in FIG. 1A provides advantageous transistor operation in terms of high voltage blocking capability. Critical components of the transistor structure are labeled. Details of the electrical performance in the given exemplary embodiment are described below.

Referring to FIG. 1A, in one embodiment, the n-type drift layer_2 has a thickness of 10 μm and a net doping concentration of 1E15-1E16 $cm^{-2}$ and is disposed on a substrate 1. The Si implantation condition 4 has 50-nm deep Si implantation with 1E20 $cm^{-3}$ box profile. The channel 3 has a height of 1 μm, a conductive gate layer length along the channel sidewall, Lg, of 0.8 μm and a channel width, Wen, of 0.3 μm (Enhancement mode) and 1 urn (Depletion mode). The A1203 gate first) dielectric layer 5 has a dielectric thickness of 30 nm. The gate conductive layer comprises at least one of Cr, Mo, W, Cu, Ni, Au, Pt, Pd, Ir, poly Si, p type semiconductor and combinations thereof. The Cr gate conductive layer 6 has a thickness of 50 nm. The SiO2 (second) dielectric spacer layer 7 has a thickness of 200 nm. The source ohmic metallization 8 comprises the following: Ti 50 nm; Al 100 nm; and Pt 10 nm. The backside ohmic metallization 9 comprises the comprises the following: Ti 50 nm and Au 100 nm.

It should be noted that either of the first or second dielectric layers can be of varying cross-section and can also be comprised of different dielectric materials To achieve high blocking voltages, it is found that, in some embodiments, the gate length should be >0.8 μm (>0.8 times the channel height) and channel width should be ~0.3 μm or less. However, if the channel width is too small, the electron mobility in the channel would be severely degraded and the output current would be reduced.

Figure 1B:
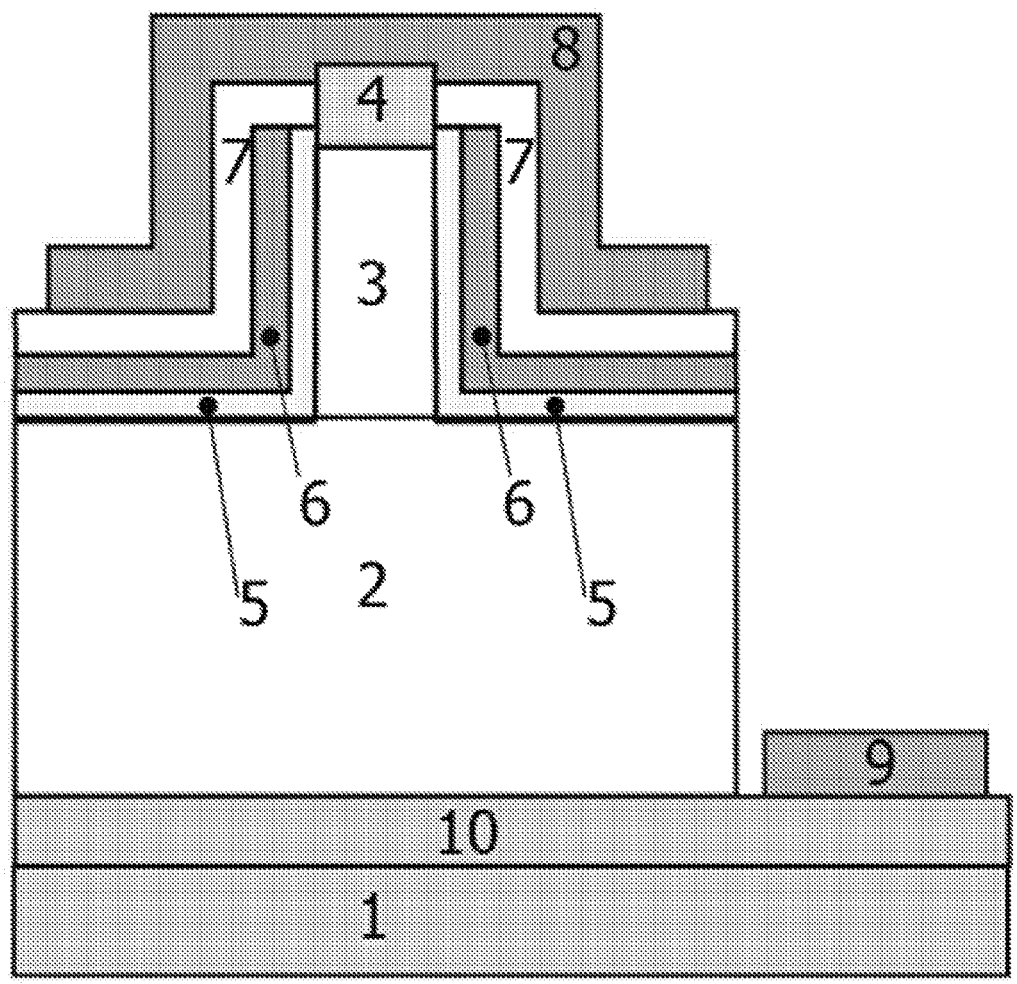
FIG. 1B shows a schematic cross-section of another embodiment of a Ga$_2$O$_3$ vertical power device in accordance with the subject technology.

Another embodiment of the vertical gallium oxide device of the teachings (subject technology) is shown in FIG. 1B. The components are labeled as in FIG. 1a. FIG. 1B shows a drain layer then disposed between the substrate one and the drift layer 2. The drain contact 9 is disposed on a section of the drain layer 10. It should be noted that, drain layer 10 is optional. In the case where substrate 1 is conductive, then drain layer 10 is not necessary; In the case where substrate 1 is insulating, then drain layer 10 should be n type with similar doping concentration to source layer 4.

In one embodiment, a device in accordance with the subject technology can be fabricated on commercially available conductive $Ga_2O_3$ substrates. First, the epitaxial layers were grown by HVPE on n-type bulk Ga2O3 (001) substrates (n=$2\times10^{18}$ cm$^{-3}$). The 10-μm thick n-Ga2O3 epitaxial layer is doped with Si with a target doping concentration of <$2\times10^{16}$ cm$^{-3}$. Then, Si ion implantation is applied to the top surface of the substrate, followed by an activation annealing at 1000° C., to facilitate ohmic contact formation. A metal hard mask is patterned using electron beam lithography (EBL) to define the fin channel with a fin width ranging from 200 nm-1 um. Subsequently, the vertical fins are formed using a $BCl_3$/Ar based dry etch, resulting a fin-pillar height of ~1 μm. An $Al_2O_3$ gate dielectric of 20-100 nm is deposited using atomic layer deposition (ALD). The gate metal layer contact is deposited by sputtering of Cr metal of thickness 40-100 nm. The gate pads were deposited a few microns away from the channel for the convenience of electrical measurements. A photoresist planarization process is then used to selectively expose the Cr and $Al_2O_3$ on top of the channel to plasma etching while protecting other areas of the wafer.

Figure 2:
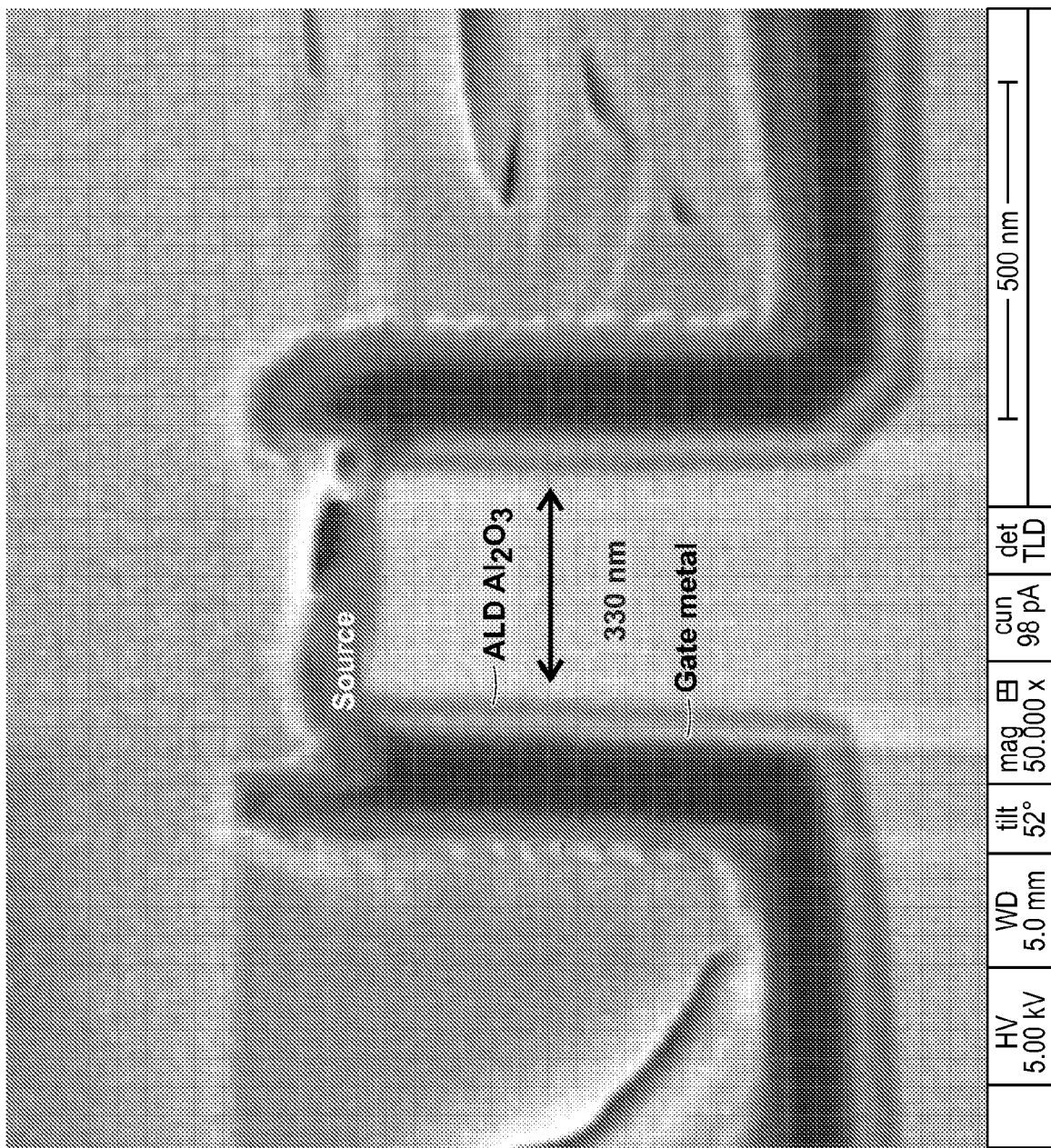
FIG. 2 shows an SEM cross-section image an embodiment of a Ga$_2$O$_3$ vertical power device in accordance with the subject technology.

The planarization process is described hereinbelow. A layer of photoresist is spun on the surface of the sample so that the top surface of the photoresist is flat. The photoresist is etched in an $O_2$ plasma asher until the top of the channel is exposed. Cr and $Al_2O_3$ on top of the channel are etched away using dry etching. A $SiO_2$ spacer layer is used to isolate the gate and source contacts, and a second planarization process is used to remove $SiO_2$ on top of the channel. Finally, source ohmic contacts are formed by depositing Ti, Al, and Pt, and device isolation is realized by etching away $SiO_2$ and Cr between active devices. A cross-section image of a completed device taken in a focused ion beam (FIB) scanning electron microscopy (SEM) system is shown in FIG. 2. The channel width is measured to be 330 nm and the vertical gate length is 795 nm excluding the rounded corners at the bottom of the etched channel. Other fabrication methods arev within the scope of these teachings.

In alternative embodiments, alterations to the embodiments described above can be used. All crystal orientations of β-$Ga_2O_3$, including (001), (−201), (010), (100), and the like are applicable using the device processes described above. Both depletion mode and enhancement mode transistors can be fabricated using the same device processes by adjusting the channel width $W_{ch}$. Gate dielectric material can be replaced by $SiO_2$, $HfO_2$, $SiN_x$, AlN, SiON, $ZrO_2$, $La_2O_3$, and combinations thereof. Similar device processes can be applied, and device operation is the same in principle. Doping concentration of the channel can be adjusted from 1E15 cm$^{-3}$ to 1E17 cm$^{-3}$. Drift layer doping concentration can be adjusted from 1E15 cm$^{-3}$ to 1E17 cm$^{-3}$. Source/drain ohmic contact metallization can be replaced by multiple combinations of Si, Ti, Al, Ni, Au metal alloys. Gate metallization can be replaced by Cr, Mo, W, or like metals that can be easily removed by dry etching. Additional edge termination, i.e. field plates and implantation can be applied at the edges of the gate pads to improve the breakdown voltages. Rounding of the bottom corner of the channel and thicker gate dielectric at the bottom of the channel can be applied to the device structure to improve breakdown voltages.

Figures 3A, 3B:
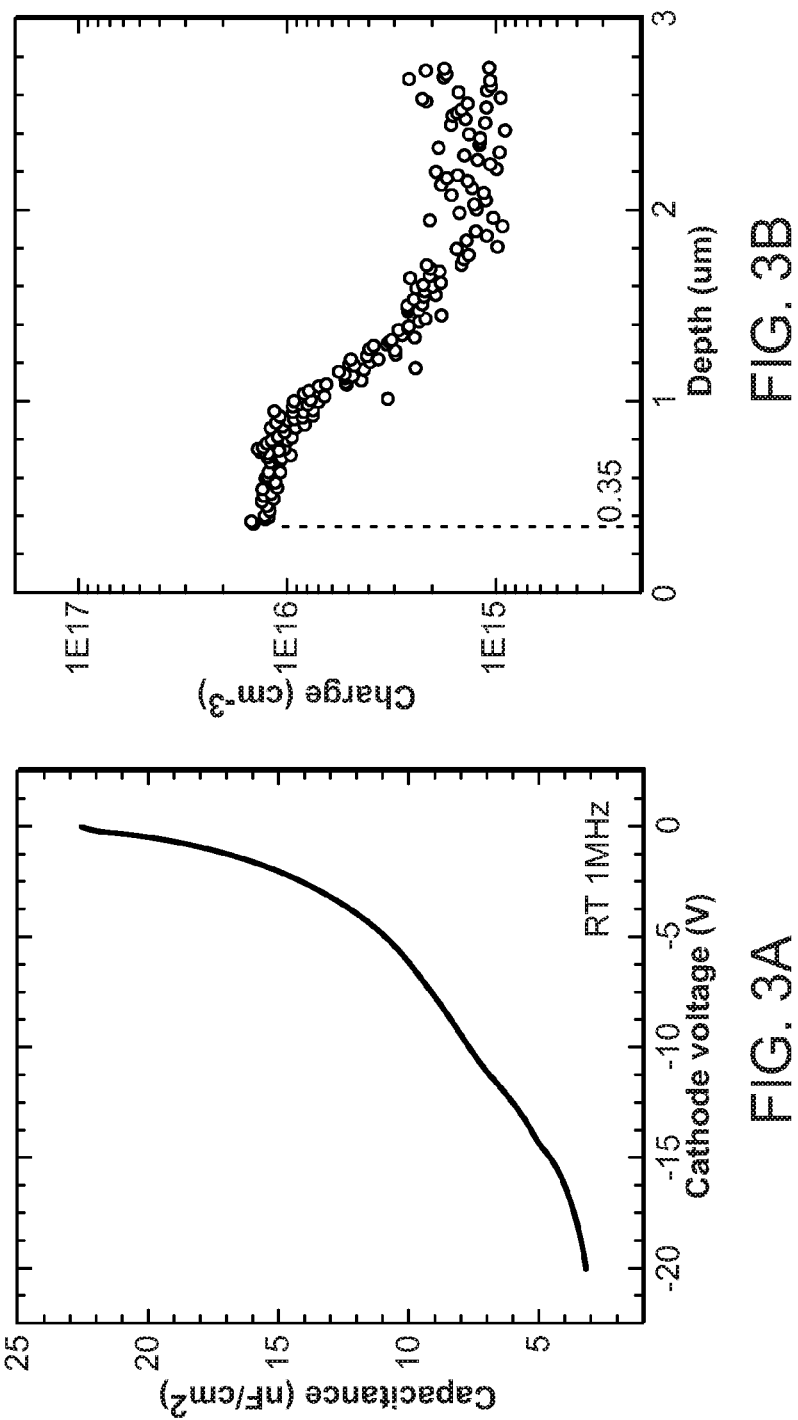
FIG. 3A shows C-V characteristics of a vertical MOS capacitor on the etched HVPE Ga$_2$O$_3$ drift layer.
FIG. 3B shows net charge concentration as a function of depth in the n-Ga$_2$O$_3$ drift layer extracted from the C-V data in FIG. 3A.

Referring now to FIGS. 3A and 3B, for the above described embodiment, doping concentration and thickness of the epitaxial layer are described. The net charge concentration ($N_D$-$N_A$) in the n-$Ga_2O_3$ drift layer is estimated using capacitance-voltage (C-V) measurements on the vertical Cr/$Al_2O_3$/$Ga_2O_3$ MOS capacitors in the regions between transistors, which were defined in the same step with the gate pads. The net doping concentration is found to decrease from ~$1.2\times10^{16}$ cm$^{-3}$ at ~0.35 um below the etched $Ga_2O_3$ surface to ~$1\times10^{15}$ cm$^{-3}$ at >2 um below the etched $Ga_2O_3$ surface. This range of the net charge concentration is consistent with the profile desired to achieve E-mode operation and high breakdown voltage. Thickness of the n− epitaxial layer is 10 um. The breakdown voltage can be further increased by increasing the thickness of the n− layer.

Figure 4:
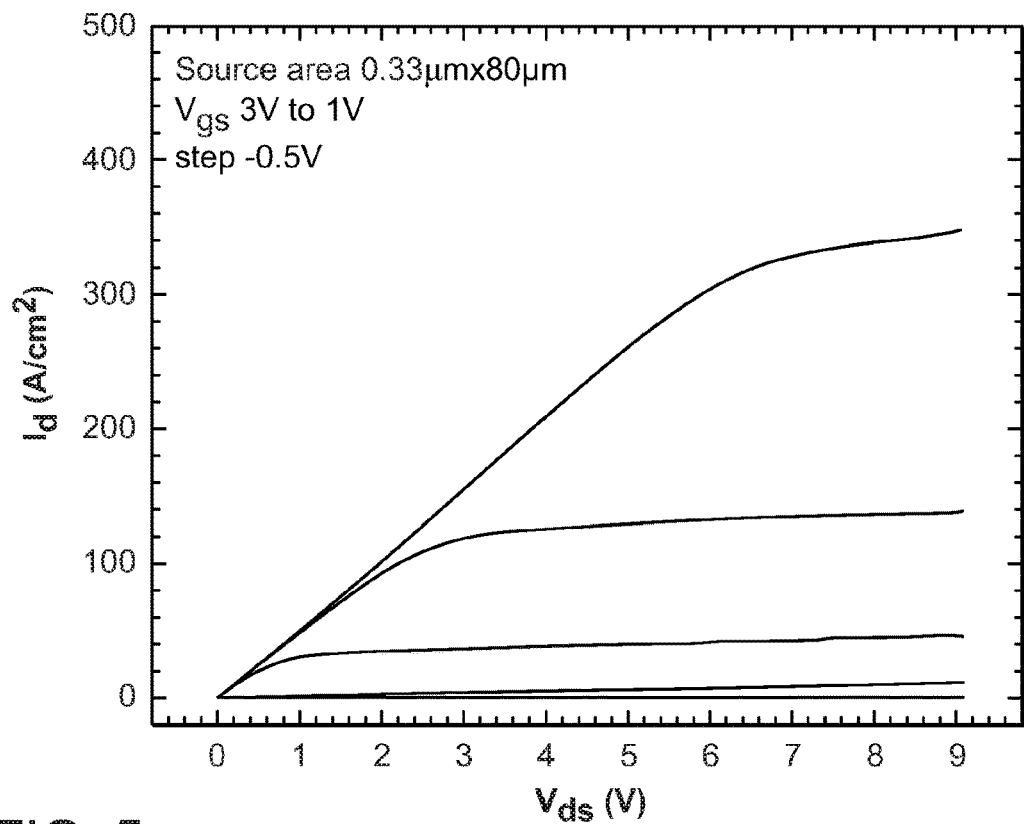
FIG. 4 shows representative $I_d/V_{ds}$ characteristics of a Ga$_2$O$_3$ vertical power MISFET as in FIG. 1.

Referring now to FIG. 4, for the above described embodiment, representative $I_d$-$V_{ds}$ family curves (pulsed) of a fabricated vertical $Ga_2O_3$ MOSFET with a source area of 0.33 μm×80 μm are shown. At $V_{gs}$ of 3 V and $V_{ds}$ of 10 V, the drain current reaches ~350 A/cm$^2$ with an associated differential on-resistance of ~18 mΩ.cm$^2$, normalized to the area of the n+$Ga_2O_3$ source. Non-uniformity due to device processing led to variations in device performance, including the drain current density ranging from 300 to 500 A/cm$^2$, the on-resistance in the range of 13-18 mΩ.cm$^2$, and the threshold voltage ($V_{th}$) in the range of 1.2-2.2 V, though the devices were designed to have the same geometry.

Figure 5:
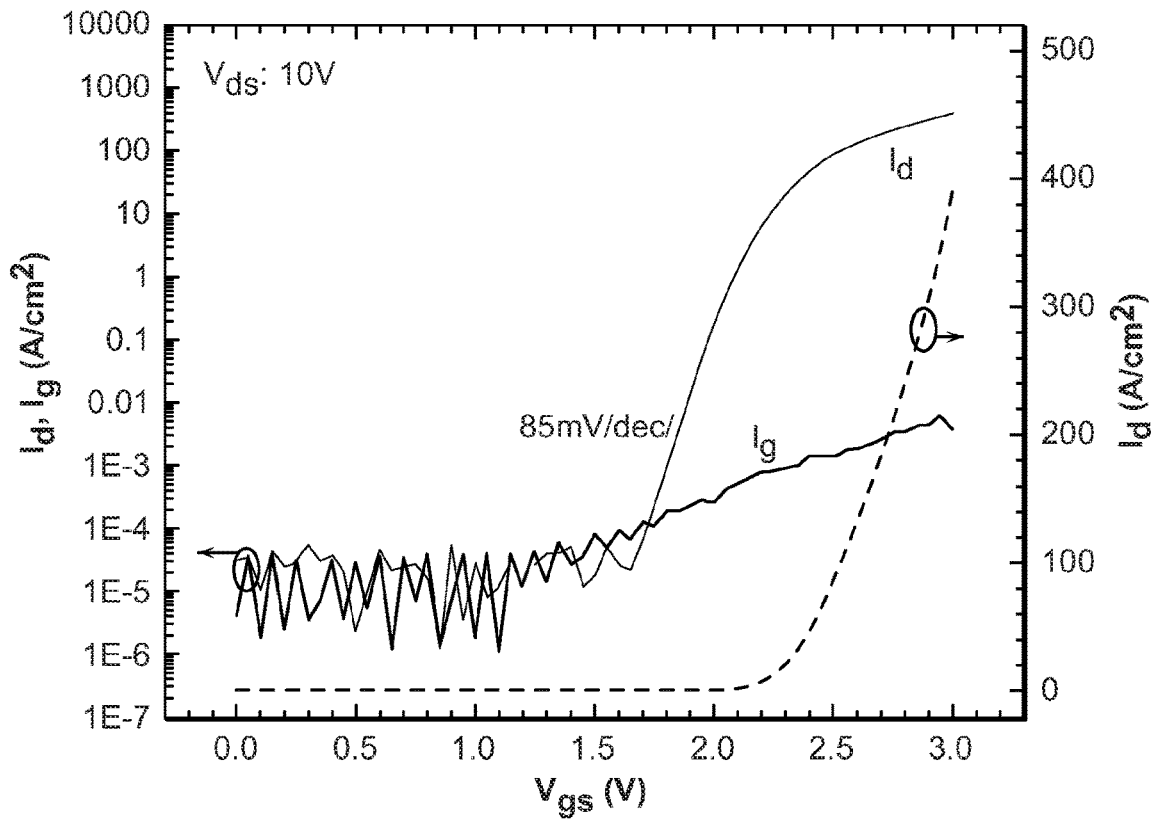
FIG. 5 shows representative $I_d/I_g$-$V_{gs}$ transfer characteristics in the semi-log and linear scale, along with the extracted subthreshold slope; of a Ga$_2$O$_3$ vertical power MISFET as in FIG. 1

Referring now to FIG. 5, for the above described embodiment, the representative $I_d$-$V_{gs}$ transfer characteristics of these devices are shown. The $V_{th}$ defined by linear extrapolation of the drain current at the peak transconductance is ~2.2 V. At $V_{ds}$=10 V, the drain current on/off ratio is about 8 orders of magnitude, while the off-state leakage current is limited by the measurement system. The sub-threshold slope is measured to be ~85 mV/dec near a current density of 1 mA/cm$^2$ and the hysteresis is less than 0.2 V.

Referring now to FIG. 6, for the above described embodiment, the off-state leakage currents and 3-terminal breakdown voltages in these vertical power MISFETs are measured at $V_{gs}$=0 V. The representative results are plotted in FIG. 6: both the drain and gate leakage currents remain low, near the detection limit of the measurement instrument, before the hard breakdown near 1057 V.

Drain-induced barrier lowering (DIBL), a type of short channel effects, can present challenges to high voltage transistor operation. In some instances, the DIBL effect diminishes exponentially with an increasing Lg/Wch ratio. For a fixed Lg, an increment in either oxide thickness or channel width leads to a worse DIBL. Therefore, the aspect ratio 2 Lg/Wch can be applied to determine the degree of DIBL. In one instance, the gate length, Lg, and the channel width are selected such that a breakdown voltage for the vertical gallium oxide device of the subject technology is greater than 950 V.

Figure 7A:
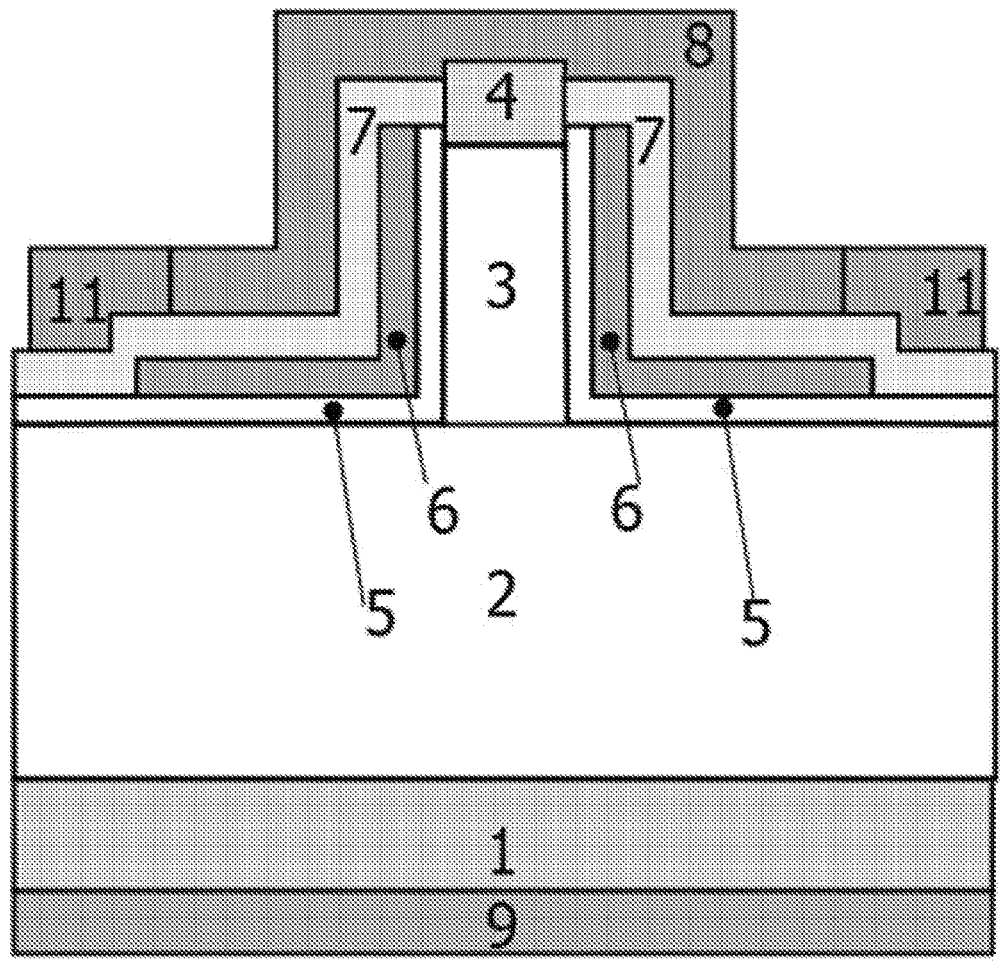
FIG. 7A is a schematic cross-section of another embodiment of a $Ga_2O_3$ vertical power device in accordance with the subject technology.

Another embodiment of the vertical gallium oxide ($Ga_2O_3$) device of the subject technology is shown in FIG. 7A with critical components of the transistor structure labeled as in FIG. 1A. In the embodiment shown in FIG. 7A, the second dielectric layer 7 is also extends beyond the gate conductive layer 6; and, the field plate layer 11 extends beyond the conductive layer. In some embodiments, the field plate layer 11 is of the same material as the source contact layer 8 and can be deposited at the same time. Field plate 11 could be the same material as the source contact 8, or a different conductive material. Another embodiment of this structure with a drain layer and drain contact similar to FIG. 1B design is also within the scope of these teachings.

Figure 8:
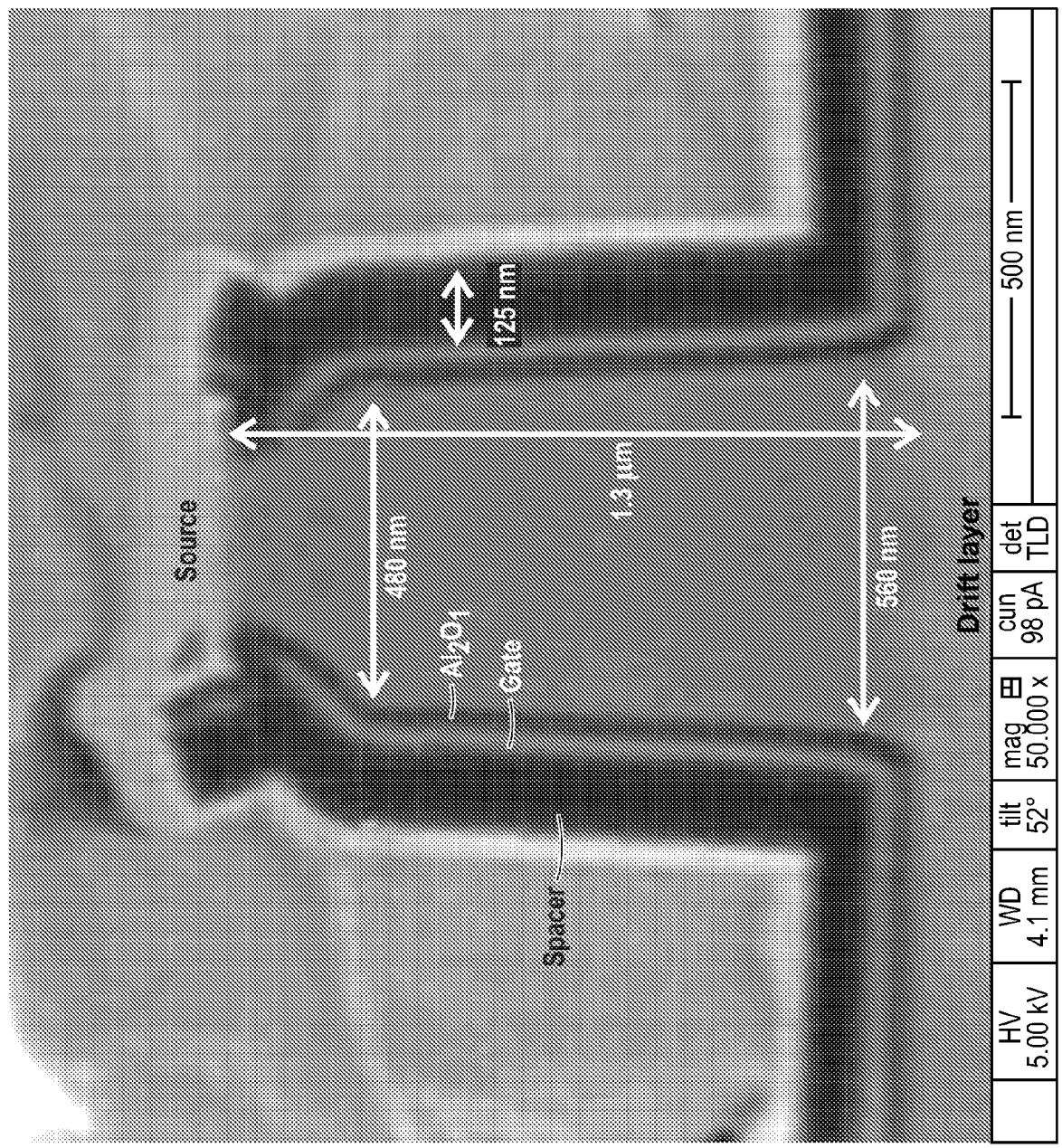
FIG. 8 shows an SEM cross section image of an exemplary instance of the embodiment of FIG. 7A.

In one instance, preparation of the embodiment shown in FIG. 7A start by growing a 10 μm n—$Ga_2O_3$ by HYPE method on a (001) $Ga_2O_3$ substrate. The process flow is described herein below. The source contact Cr/Pt is deposited on a layer of n+-Ga2O3 formed by Si ion implantation on the top surface of the wafer. The channel of the transistor is defined by electron beam lithography, and formed by dry etching in an ICP-RIE system and subsequent acid/base wet chemical treatments to remove the plasma damages. From the SEM images taken in FIG. 8, a typical fin geometry is about 1.3 µm tall and 480-560 nm wide from the source-end to the drain-end. The bottleneck structure shown in FIG. 1(b) is likely a result of the wet chemical reaction. The drain ohmic contact is then metalized, followed by conformal depositions of a thin gate dielectric (Al2O3 by Atomic Layer Deposition (ALD)) and a gate metal (Cr) layer to form MOS structures on both sidewalls of the fin channel. The gate-source spacing is defined in the gate etchback step which includes a critical photoresist based planarization process. A thick layer of ALD $Al_2O_3$ is used to realize the source-gate isolation, as well as to support the field plate extension. Finally, the source pad is conformally deposited in a sputtering system, forming the source-connected field plate at the same time. Relevant processing steps are schematically shown in FIGS. 9A-9F.

Compared to the embodiment shown in FIG. 1A, the embodiment shown in FIG. 7A features a reduced gate area and an extended source pad outside the gate edge. This allows the implementation of a field plate (FP) without complicating the processing steps. This improves device yield and facilitates low-cost fabrication. The finished Ga2O3 FinFET (FIGS. 7A and 7B) has a 30-nm gate dielectric (ALD $Al_2O_3$), a 125-nm ($h_{fp}$) ALD $Al_2O_3$ source-gate spacer and a source metal layer with a 10-im FP extension (Lfp) outside of the gate edges. These modifications of the embodiment shown in FIGS. 7A and 7B significantly improve the breakdown Voltage (BV) of the transistors to >1.6 kV.

Figure 7B:
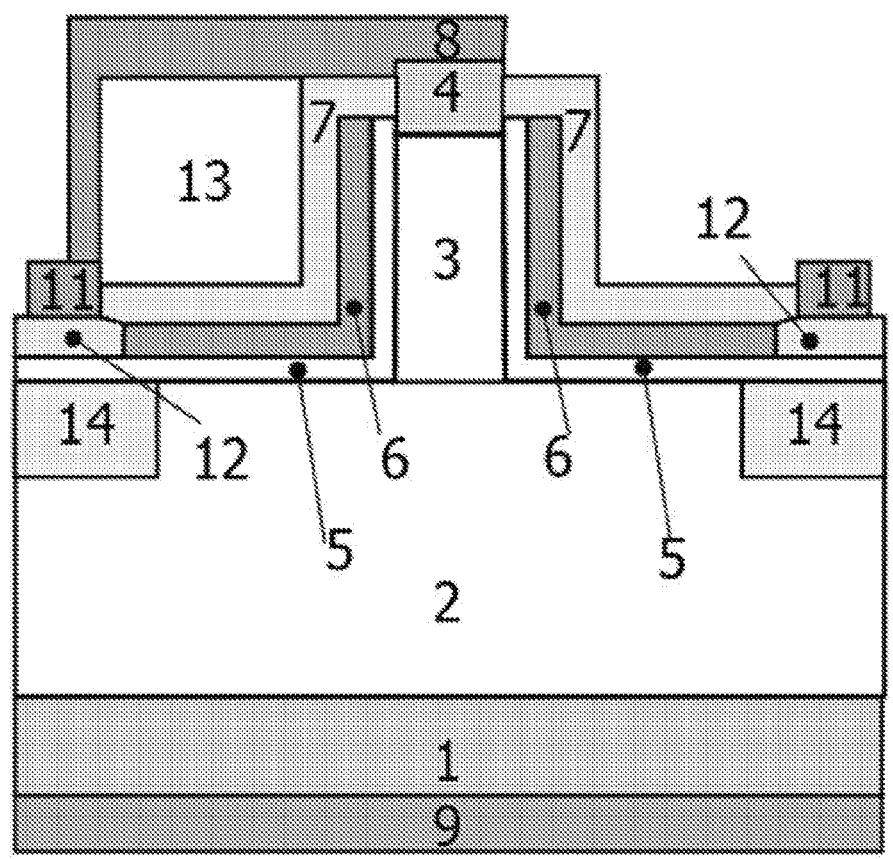
FIG. 7B is a schematic cross-section of yet another embodiment of a $Ga_2O_3$ vertical power device in accordance with the subject technology.
Figure 10A:
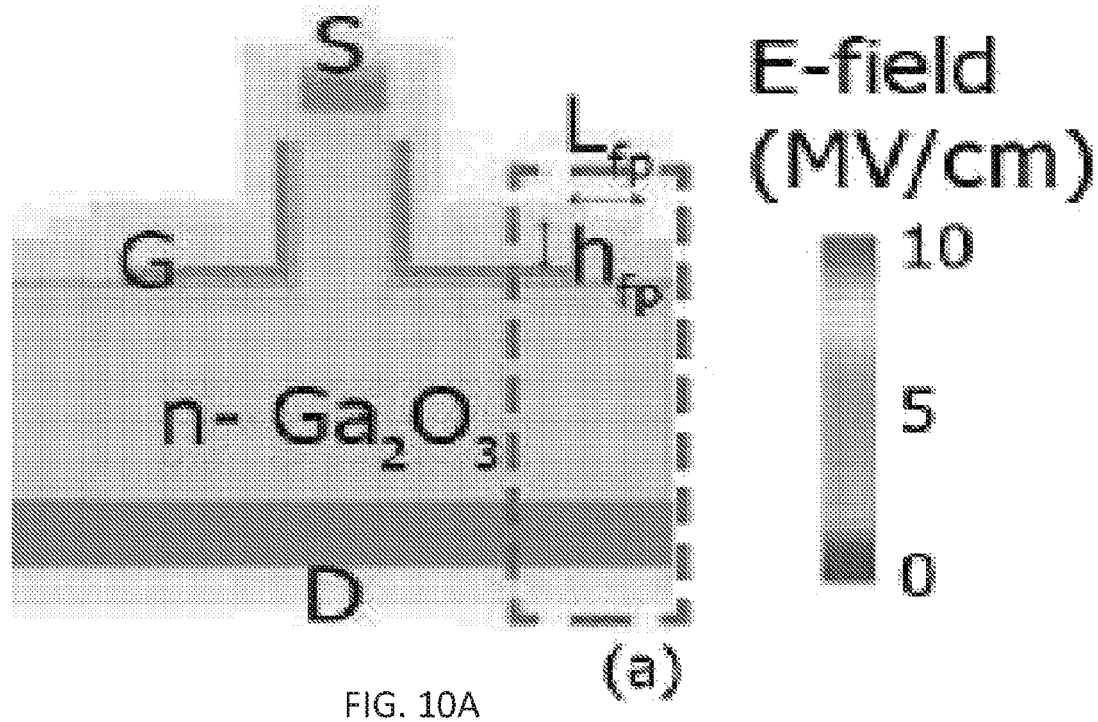
FIG. 10A shows the area of FIG. 7A for which simulation results are shown.
Figure 10B:
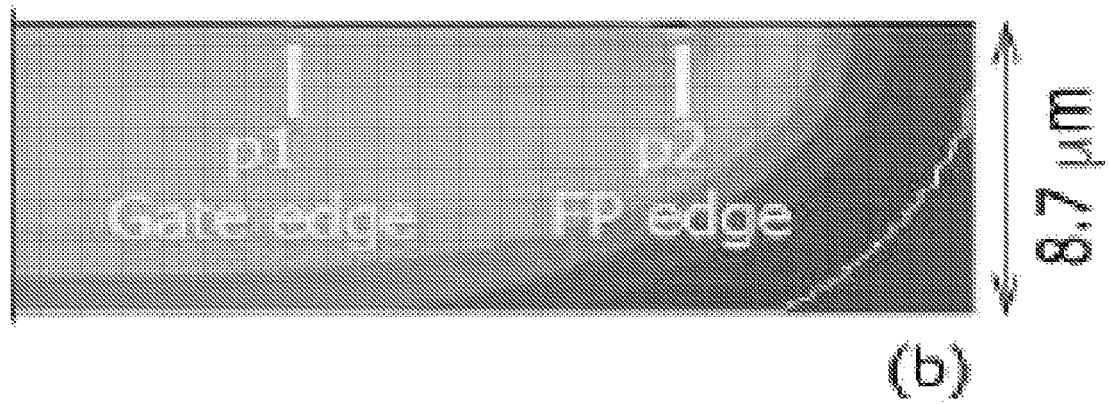
FIG. 10B shows results of simulation of off-state electric field distribution at Vds=1600 V in the area shown in FIG. 10A.

2D simulations are performed to guide the design of the device for high BVs. It can be shown by both electrostatic analysis and numerical simulation that the electric field at the bottom of the fin channel is reduced significantly with a narrower fin channel width (Wch). For example, for Wch-0.5 in channels in the FinFETs in the embodiment as shown in FIGS. 7A and 7B and parameters used in FIG. 10A, the electric field peak value at the bottom corner of the channel is 3.05 MV/cm, while peak value underneath the central area of the gate pad is 3 MV/cm. FIG. 10B shows results of simulation of off-state electric field distribution at Vds=1600 V showing electric field peaks at the gate (p1) and FP (p2) edges. In the case simulated Lfp=10 µm, hfp=0.125 µm, Nd=$1.2 \times 10^{16}$ $cm^{-3}$ In comparison, the peak value at the edge of the gate pad is 9 MV/cm without any RESURF (Reduced Surface Field effects) (all values are taken at a depth of 0.1 in below the etched Ga2O3 surface). The stark difference is explained as the following: a gate without an edge termination has a lateral depletion region outside the edge, leading to severe electric field crowding typically described by the cylindrical junction model. Due to the symmetry of the double-sided gate structure, the lateral depletion width near the bottom of the fin channel is limited to Wch/2. This effectively removes a majority of the space charges outside of the gate edge that would have caused the electric field crowding.

Figure 11:
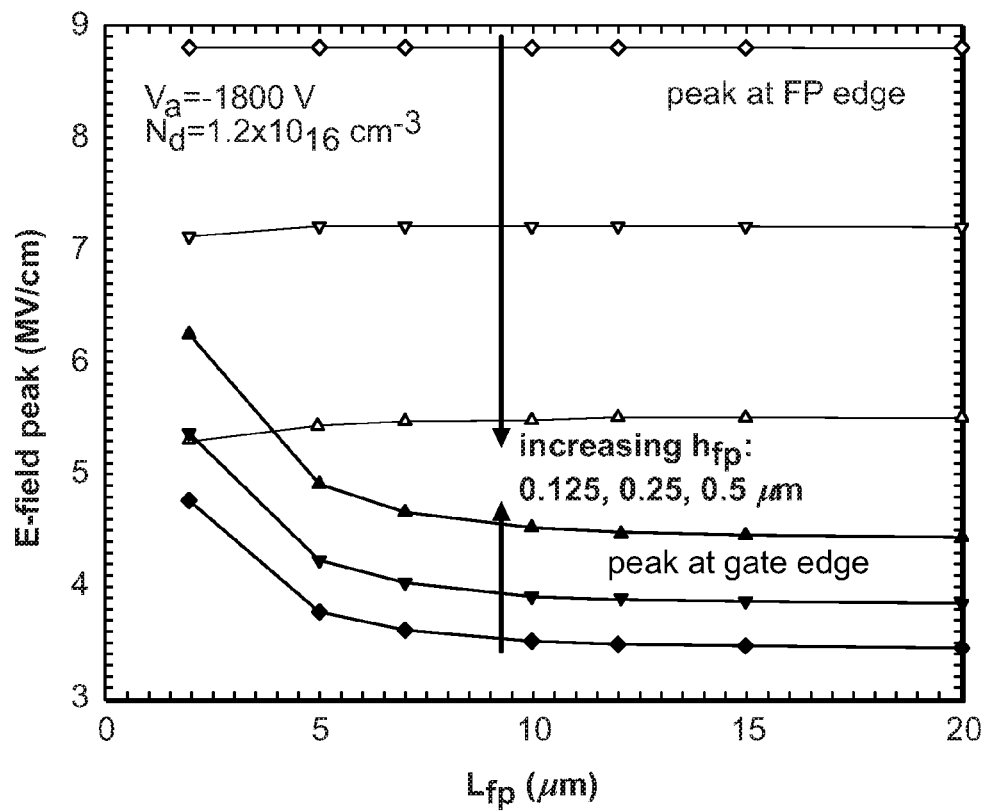
FIG. 11 shows results of simulation electric field peaks at the gate and FP edge as functions of FP length ($L_{fp}$)
Figure 12:
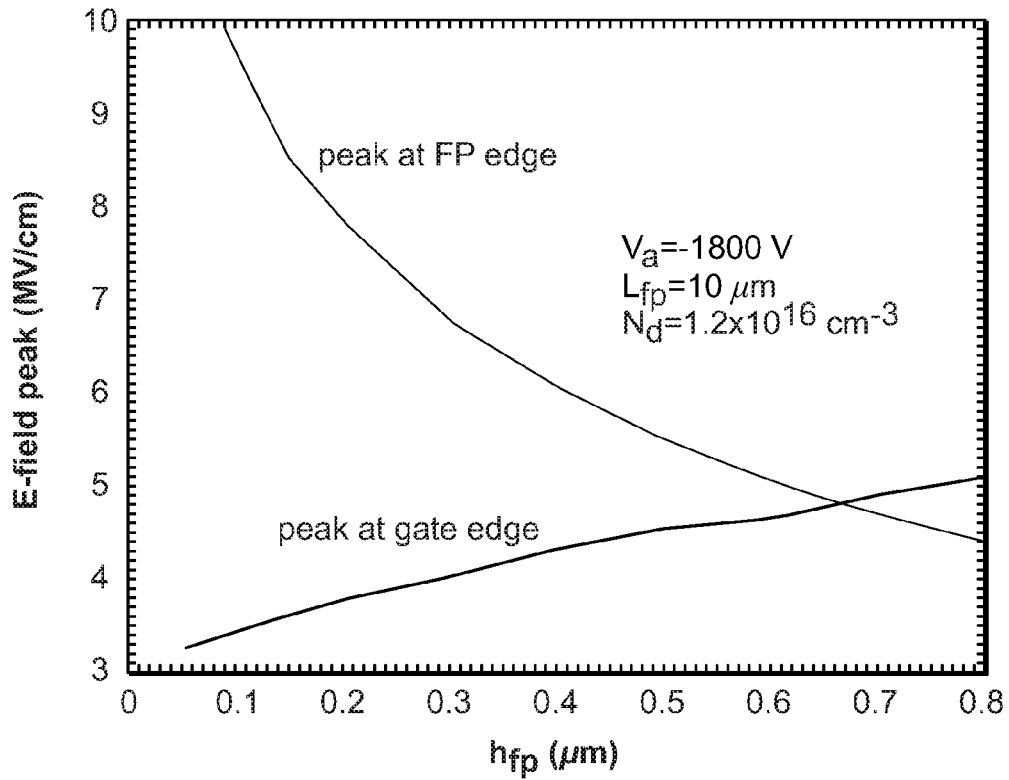
FIG. 12 shows results of simulation electric field peaks at the gate and FP edge as functions of FP height ($h_{fp}$).

The electric field distribution near the gate edge with the addition of the FP show two peaks at the gate edge (p1) and considered for their impact on electric field peaks: the thickness of the supporting $h_{fp}$ and FP extension outside of the gate $L_{fp}$. It is discovered that for the voltage range considered, a FP extension $L_{fp}$ of 10 µm or longer is able to suppress the electric field peak p1 for any thickness value of the $h_{fp}$, while the electric field at p2 is not significantly affected by $h_{fp}$ (FIG. 11). (FIG. 11 shows simulation of electric field peaks at the gate and FP edge as functions of FP length (Lfp). E-field values are taken at a depth of 0.1 jm inside Ga2O3. Other parameters are the same as those in FIGS. 10a, 10B.) For an $L_{fp}$ value of 10 µm, the tradeoff between p1 and p2 values and their heavy dependence on $h_{fp}$ is clearly seen in FIG. 12, where the optimal value of $h_{fp}$ can be determined when the 2 field peaks have comparable magnitude. (FIG. 12 shows simulation of electric field peaks at the gate and FP edge as functions of FP height ($h_{fp}$) for a fixed $L_{fp}$ length of 10 µm. E-field values are taken at a depth of 0.1 µm inside $Ga_2O_3$. Other parameters are the same as those in FIG. 10a, 10B.)

Multiple FinFETs of the embodiment as shown in FIG. 7A and with fin channel widths ranging from 0.4 µm to 0.6 µm have been tested, and their BVs are largely independent of fin widths, indicating that breakdown is not dominated by the fin channel region. Both experimental data and simulation suggest that the breakdown is likely dominated by the dielectric breakdown at the edge of the FP (p2), which is then substantiated by the visual evidence that the most material damage after the destructive breakdown appears at the edge of the devices. In some embodiments, a height of the dielectric spacer layer from a portion of the gate layer disposed above the n-type $Ga_2O_3$ material layer to the source connected metal layer, and a distance over which the source connected metal layer extends beyond the gate pad are selected such that a breakdown voltage for the vertical gallium (III) trioxide transistor is greater than 1000 V.

Still another embodiment of the vertical gallium oxide (Ga2O3) device of the subject technology is shown in FIG. 7B with critical components of the transistor structure labeled as in FIG. 1A. Referring to FIG. 7B, in the embodiment shown therein, the field plate 11 is not connected to the source contact on both sides. A third dielectric 12 is disposed between the field plate 12 and the first dielectric 5. A fourth dielectric 13 is disposed between the second dielectric 7 and the source contact 8. Resistive edge terminations 14 are disposed underneath the third dielectric and the first dielectric and the field plate and in contact with the drift layer 2 and disposed below a surface of the n-type $Ga_2O_3$ drift layer opposite the substrate.

The resistive terminal 14 can be fabricated, for example, by implanting nitrogen or iron ions, or by etching the n-type $Ga_2O_3$ drift layer and filling with the dielectric. Other fabrication methods are also within the scope of these teachings.

Field plate 11 could be the same material as the source contact 8, or a different conductive material. Field plate 11 may be in direct contact with 14, or on top of 5, or on top of 12. Third dielectric 12 could be the same material as second dielectric 7, or a different dielectric. Fourth dielectric or inert gas 13 could be the same dielectric or different from 5, 7 and 12, or inert gas Helium, Neon, Argon, Krypton, Xenon, Radon or Nitrogen. Another embodiment of this structure with a drain layer and drain contact similar to FIG. 1B design is also within the scope of these teachings. The inclusion of resistive edge termination 14 may increase the breakdown voltage of the device. The same design of 14 can be included in FIG. 7A.

One skilled in the art would understand that the present disclosure has a substantial number of other applications and that the embodiment presented hereinabove our exemplary embodiments. The present disclosure is not limited only to the exemplary embodiments.

The use of the word "about," avoids a strict numerical boundary to the specified parameter. The word "about," as used herein, refers to the uncertainty in the value that comes from the uncertainty in measurements of that value. Such uncertainty is typical of every measurement equipment and measurement method, and ranges up to 10 to 15%.

While the subject technology has been described with respect to preferred embodiments, those skilled in the art will readily appreciate that various changes and/or modifications can be made to the subject technology without departing from the spirit or scope thereof. For example, each claim, in whole or in part, may depend from any or all claims in a multiple dependent manner even though such has not been originally claimed.

What is claimed is:

1. A vertical gallium oxide (Ga2O3) device comprising: a substrate;
   an n-type $Ga_2O_3$ drift layer disposed on a surface of the substrate;
   an n-type semiconducting channel extending from a surface of the n-type Ga2O3 drift layer, the n-type semiconducting channel being one of fin-shaped or nanowire shaped; an n-type source layer disposed on the channel; the source layer has a higher doping concentration than the n-type semiconducting channel; no p-type semiconducting layer being used in the vertical gallium oxide ($Ga_2O_3$) device;
   a first dielectric layer directly on the n-type $Ga_2O_3$ drift layer and on sidewalls of the n-type semiconducting channel;
   a conductive gate layer deposited on at least a portion of the first dielectric layer and insulated from the n-type source layer, n-type semiconducting channel as well as n-type $Ga_2O_3$ drift layer;
   a second dielectric layer deposited over the conductive gate layer, covering completely the conductive gate layer on channel sidewalls; and
   an ohmic source contact deposited over the n-type source layer and over at least a part of the second dielectric layer; the source contact being configured not to be in electrical contact with the conductive gate layer.

2. The vertical gallium oxide device of claim 1 further comprising a drain layer in electrical contact with the n-type $Ga_2O_3$ drift layer at a location opposite to a channel location.

3. The vertical gallium oxide device of claim 1 wherein the substrate is one of the following: $Ga_2O_3$, AlN, SiC, diamond, sapphire, Si, BN, and combinations thereof.

4. The vertical gallium oxide device of claim 1 wherein the substrate is conductive.

5. The vertical gallium oxide device of claim 1 wherein the drift layer has a doping concentration of between $10^{14}$ $cm^{-3}$ to $10^{18}$ $cm^{-3}$.

6. The vertical gallium oxide device of claim 1 wherein the n-type source layer has a height at least 20 nm from the n-type semiconducting channel.

7. The vertical gallium oxide device of claim 1 wherein the n-type source layer has a same cross-sectional area as the n-type semiconducting channel.

8. The vertical gallium oxide device of claim 1 wherein the n-type source layer is formed from n-type $Ga_2O_3$ material having a higher donor doping concentration than the n-type semiconducting channel.

9. The vertical gallium oxide device of claim 1 further comprising a gate metal pad deposited on the conductive gate layer; the gate metal pad being deposited a predetermined distance away from that channel.

10. The vertical gallium oxide device of claim 1 wherein a height of the n-type semiconducting channel covered by the conductive gate layer is at least larger than a width of the n-type semiconducting channel.

11. The vertical gallium oxide device of claim 1 wherein a width of the n-type semiconducting channel is between about 5 nm to 2 pm.

12. The vertical gallium oxide device of claim 1 wherein a width of the n-type semiconducting channel is between 270 nm and 340 nm.

13. The vertical gallium oxide device of claim 1 wherein a width of the n-type semiconducting channel varies along the n-type semiconducting channel.

14. The vertical gallium oxide device of claim 1 wherein each of the first and second dielectric layer are selected from one of $A_{12}O_3$, SiO2, HfO2, $SiN_x$, AlN, SiON, ZrO2, or La2O3 and combinations thereof.

15. The vertical gallium oxide device of claim 1 wherein at least one of the first and second dielectric layer is selected to be an insulator having a wider band gap than $Ga_2O_3$.

16. The vertical gallium oxide device of claim 1 wherein a width of the channel, a height of the channel, and a height of the conductive gate layer along channel sidewall are selected such that a breakdown voltage for the vertical gallium oxide device is greater than 500 V.

17. The vertical gallium oxide device of claim 1 wherein the conductive gate layer comprises at least one of Cr, Mo, W, Cu, Ni, Au, Pt, Pd, Ir, poly Si, and combinations thereof.

18. The vertical gallium oxide device of claim 1 wherein the second dielectric layer is also deposited over the conductive gate layer.

19. The vertical gallium oxide device of claim 18 wherein the second dielectric layer extends beyond the conductive gate layer; and, wherein a conductive field plate layer extends beyond the conductive gate layer and over the second dielectric layer.

20. The vertical gallium oxide device of claim 19 wherein a width of the n-type semiconducting channel, a height of the second dielectric layer from a portion of the gate metal layer disposed above the n-type $Ga_2O_3$ drift layer to the ohmic source contact layer, and a distance over which the conductive field plate layer extends beyond the conductive gate layer are selected such that a breakdown voltage for the vertical gallium oxide device is greater than 500 V.

21. The vertical gallium oxide device of claim 1 wherein the substrate is nonconducting.

22. The vertical gallium oxide device of claim 1 wherein a height of the n-type semiconducting channel covered by the conductive gate layer is at less than a width of the n-type semiconducting channel.

23. The vertical gallium oxide device of claim 1 wherein the n-type source layer has a varying cross section.

24. The vertical gallium oxide device of claim 1 further comprising resistive edge termination layers extending beyond the conductive gate layer and below a surface of the n-type $Ga_2O_3$ drift layer opposite the substrate.

25. The vertical gallium oxide device of claim 19 further comprising resistive edge termination layers extending from below the conductive field plate layer and disposed below a surface of the n-type $Ga_2O_3$ drift layer opposite the substrate.

26. The vertical gallium oxide ($Ga_2O_3$) device of claim 1 wherein the conductive gate layer is deposited on substantially all of the first dielectric layer; wherein the second dielectric layer also covers the conductive gate layer over the n-type $Ga_2O_3$ drift layer; and wherein the ohmic source contact is deposited over the second dielectric layer covering the conductive gate layer on channel sidewalls and at least a part of the second dielectric layer covering the conductive gate layer over the n-type $Ga_2O_3$ drift layer.

27. The vertical gallium oxide ($Ga_2O_3$) device of claim 1 wherein the conductive gate layer is deposited on a portion of the first dielectric layer; wherein the second dielectric layer also covers the conductive gate layer over the n-type $Ga_2O_3$ drift layer and a portion of the first dielectric layer, the portion of the first dielectric layer not being covered by the conductive gate layer; and wherein the ohmic source contact is deposited over the second dielectric layer covering the conductive gate layer on channel sidewalls and at least a part of the second dielectric layer covering the conductive gate layer over the n-type $Ga_2O_3$ drift layer; the vertical gallium oxide ($Ga_2O_3$) device also comprising a field plate conductive layer disposed on at least some of a portion of the second dielectric layer; the portion of the second dielectric layer being disposed over the portion of the first dielectric layer not being covered by the conductive gate layer; the field plate conductive layer being in contact with the ohmic source contact.

28. A vertical group III trioxide transistor comprising:
a drain contact layer;
a substrate on the drain contact layer;
an n-type group III trioxide material layer on the substrate, the n-type group III trioxide material comprising one of $Ga_2O_3$, $InO_3$, a combination thereof, or $(Al_xGa_{1-x})_2O_3$; wherein the n-type group III trioxide material layer forms an upstanding channel having a distal top surface and a sidewall extending between the distal top surface and the n-type group III trioxide material layer;
a source layer applied directly to the distal top surface; the source layer being an n-type layer;
the n-type group III trioxide material layer and the source layer being n-type group III trioxide semiconducting material layers; no p-type semiconducting layer being used in the vertical group III trioxide transistor; gate dielectric layer deposited directly on the n-type group III trioxide material layer, wherein a portion of the gate dielectric layer is on the sidewall; a gate layer on the gate dielectric layer including the portion on the sidewall but not connected to the source layer; a dielectric spacer layer deposited over a sidewall of the source layer, the sidewall of the channel, the gate layer and the gate dielectric layer; and
a source-connected metal layer deposited over the source layer and the dielectric spacer layer.

29. The vertical group III trioxide transistor of claim 28 wherein the n-type group III trioxide material layer has a donor density between $1\times10^{18}/cm^3$ and $10^{14}/cm^3$.

30. The vertical group III trioxide transistor of claim 28 wherein a width of the channel is between 5 nm and 62 nm.

31. The vertical group III trioxide transistor of claim 28 wherein a width of the channel is between 400 nm and 600 nm.

32. The vertical group III trioxide transistor of claim 28 wherein a height of the dielectric spacer layer from a portion of the gate layer disposed above the n-type group III trioxide material layer to the source connected metal layer, and a distance over which the source connected metal layer extends beyond the gate pad are selected such that a breakdown voltage for the vertical group III trioxide transistor is greater than 500 V.

* * * * *